(12) United States Patent
Kingsley et al.

(10) Patent No.: US 8,386,983 B1
(45) Date of Patent: Feb. 26, 2013

(54) PARALLEL SIGNAL ROUTING

(75) Inventors: Christopher H. Kingsley, Longmont, CO (US); George L. McHugh, Berthoud, CO (US)

(73) Assignee: Xilinx, Inc., San Jose, CA (US)

( * ) Notice: Subject to any disclaimer, the term of this patent is extended or adjusted under 35 U.S.C. 154(b) by 56 days.

(21) Appl. No.: 12/853,810

(22) Filed: Aug. 10, 2010

(51) Int. Cl.
G06F 17/50 (2006.01)

(52) U.S. Cl. ........................................ 716/126

(58) Field of Classification Search .................. 716/100, 716/126
See application file for complete search history.

(56) References Cited

U.S. PATENT DOCUMENTS

| | | | |
|---|---|---|---|
| 5,587,923 A | 12/1996 | Wang | |
| 5,784,289 A | 7/1998 | Wang | |
| 5,875,117 A | 2/1999 | Jones et al. | |
| 6,412,102 B1 | 6/2002 | Andreev et al. | |
| 6,480,991 B1 | 11/2002 | Cho et al. | |
| 7,134,112 B1 | 11/2006 | Anderson et al. | |
| 7,707,536 B2 | 4/2010 | Lin et al. | |
| 8,095,906 B2 | 1/2012 | Betz et al. | |
| 8,191,032 B1 * | 5/2012 | Wadland et al. | 716/136 |
| 2001/0018759 A1 * | 8/2001 | Andreev et al. | 716/7 |
| 2002/0184607 A1 | 12/2002 | Alpert et al. | |
| 2003/0005398 A1 | 1/2003 | Cho et al. | |
| 2005/0151258 A1 * | 7/2005 | Kotecha et al. | 257/758 |
| 2007/0094631 A1 | 4/2007 | Galatenko et al. | |
| 2007/0220522 A1 | 9/2007 | Coene et al. | |
| 2008/0301618 A1 * | 12/2008 | Daellenbach | 716/13 |
| 2010/0169858 A1 | 7/2010 | Betz et al. | |
| 2011/0055783 A1 * | 3/2011 | Yang | 716/122 |
| 2011/0055785 A1 * | 3/2011 | Chakanakar et al. | 716/126 |
| 2011/0055786 A1 * | 3/2011 | Gao | 716/126 |
| 2011/0055791 A1 * | 3/2011 | Gao | 716/131 |

OTHER PUBLICATIONS

U.S. Appl. No. 12/718,945, filed Mar. 5, 2010, Jain et al.

* cited by examiner

*Primary Examiner* — Suchin Parihar
(74) *Attorney, Agent, or Firm* — LeRoy D. Maunu

(57) ABSTRACT

In one embodiment, a method for parallel routing of a circuit design is provided. Placement of a netlist of the circuit design is determined for a target device. A plurality of regions of the target device is defined. Each region of the plurality of regions is assigned to a respective set of processors, each set including at least one processor. Global routing of nets of the netlist on the target device is performed. The global routing of each net restricts the net to one or more possible routes through a corresponding subset of the plurality of regions. Local routing of the netlist is concurrently performed within the plurality of regions using the respective sets of processors. Within each region, the local routing of the netlist is performed exclusively by the respective set of one or more processors.

16 Claims, 6 Drawing Sheets

United States Patent
US 8,386,983 B1

PARALLEL SIGNAL ROUTING

FIELD OF THE INVENTION

The embodiments of the present invention generally relate to the placement and routing of resources in programmable integrated circuits.

BACKGROUND

Programmable logic devices (PLDs) are integrated circuits (ICs) that are used to implement digital logic operations according to user configurable input. Example PLDs include Complex Programmable Logic Devices (CPLDs) and field programmable gate arrays (FPGAs). CPLDs often include several function blocks that are based on programmable logic array (PLA) architecture with sum-of-products logic. A configurable interconnect matrix transmits signals between the function blocks.

An example FPGA includes an array of configurable logic blocks (CLBs) and a ring or columns of programmable input/output blocks (IOBs). The CLBs and IOBs are interconnected by a programmable interconnect structure (routing resources). The CLBs, IOBs, and interconnect structure are typically programmed by loading a stream of configuration data (bitstream) into internal configuration memory cells that determine how the CLBs, IOBs, and interconnect structure function. The configuration bitstream may be read from an external memory, conventionally an external integrated circuit memory EEPROM, EPROM, PROM, and the like, though other types of memory may be used. The collective states of the individual memory cells determine the function of the FPGA. A specific type of FPGA uses a look-up-table (LUT)-based CLB. The configuration memory provides input values to a number of multiplexers controlled by inputs to the CLB.

A conventional design process for an integrated circuit, such as an ASIC or an FPGA implementation, begins with the creation of the design. The design specifies the function of a circuit at a schematic or logic level and may be represented using various hardware description languages (e.g., VHDL, ABEL or Verilog) or schematic capture programs. The design is synthesized to produce a logical network list ("netlist"), and the synthesized design is mapped onto primitive components within the target device (e.g., programmable logic blocks of an FPGA).

Following mapping, placement of the components of the synthesized and mapped design is then performed for the target device. During placement, each mapped component of the design is assigned to a physical position on the chip. The placer attempts to place connected design objects in close physical proximity to one another, in order to conserve space and increase the probability that the desired interconnections between components will be successfully completed by the router. Placing connected components close to one another also generally improves the performance of the circuit, since long interconnect paths are associated with excess capacitance and resistance, resulting in longer delays and greater power consumption.

Specified connections between components of the design are routed within the target device for the placed components. The routing process specifies physical wiring resources that will be used to conduct signals between pins of placed components of the design. For each connection specified in the design, the routing process allocates wire resources necessary to complete the connection. As used herein, the selection and assignment of wire resources in connecting the output pin of one component to the input pin of another component is referred to as routing a net. When nets have been routed using most or all of the wiring resources in a given area, the area is generally referred to as congested, which creates competition for the remaining wiring resources in the area, and may even make the routing of additional nets in the area impossible.

The disclosed embodiments may address one or more of the above issues.

SUMMARY

In one embodiment, a method of parallel routing of a circuit design is provided. Placement of a netlist of the circuit design is determined for a target device. A plurality of regions of the target device is defined. The plurality of regions is assigned to respective sets of processors, each set including at least one processor. Global routing of nets of the netlist on the target device is performed. The global routing of each net restricts the net to one or more possible routes through a corresponding subset of the plurality of regions. Local routing of the netlist is concurrently performed within the plurality of regions using the respective sets of one or more processors. That is, the local routing of the netlist within a first region is performed concurrently with the local routing of the netlist within at least a second region. Within each region, the local routing of the netlist is performed exclusively by the respective set of one or more processors.

In another embodiment, in response to a failure to locally route a net within a first region of the subset of the plurality of regions, boundaries are shifted between two or more regions including the first region and a second region of the plurality of regions. The net is locally rerouted within one or more regions in the corresponding subset of the plurality of regions.

In response to a failure to locally route a net within a first region of the subset of the plurality of regions, a second global routing of the net on the target device is performed in another embodiment. The second global routing of the net restricts the net to one or more possible routes through an additional subset of the plurality of regions. The net is locally rerouted in the additional subset of the plurality of regions.

In another embodiment, the local routing of the netlist within each of the plurality of regions includes: determining congestion data including costs of routing resources for the region, and routing portions of nets within the region according to the congestion data.

Critical and non-critical nets are determined in another embodiment. In routing the portions of nets within each region, critical nets are given priority over non-critical nets for the routing resources.

In another embodiment, the local routing of the netlist within the plurality of regions is performed in iterations. Each iteration routes a respectively selected net within each region. The determining of congestion data includes updating the congestion data between iterations of the local routing.

Updating the congestion data, in another embodiment, includes communicating status messages indicating routability of a net to the respective sets of one or more processors of one or more regions in the subset of the plurality of regions through which possible routes for the net are restricted. In response to status messages indicating the net is unroutable, the net is rerouted by the respective sets of one or more processors of the one or more regions. In response to status messages indicating the net is routable, routing resources of the one or more regions are assigned to the net by the respective set of one or more processors of the one or more regions.

In another embodiment, the local routing of the netlist includes locally routing a net of the netlist, having a destination outside a first region, within the first region. Locally routing of the net within the first region includes determining possible routes from a source of the net in the first region to one or more edge-pins on a boundary between the first region and an adjacent region in the subset of regions. Locally routing the net within the first region further includes communicating messages, indicating one or more of the one or more edge-pins as options for continuing a route of the net to a destination. The messages are from a processor of the one or more processors assigned the first region to a processor of the one or more processors assigned the adjacent region.

The global routing of nets of the netlist on the target device limits nets in each one of the plurality of regions to a selected number in another embodiment.

In another embodiment, the global routing of nets of the netlist on the target device assigns approximately equal numbers of possible routes of nets of the netlist to each of the plurality of regions.

The defining the plurality of regions defines regions of the device according to boundaries between memory units in another embodiment.

In another embodiment, a system for parallel routing of a circuit design is provided. The system includes a plurality of processors and a memory arrangement coupled to the processor. The memory arrangement is configured with instructions that when executed by one or more of the plurality of processors cause the plurality of processors to perform a number of operations. The instructions cause the processors to determine placement of a netlist of the circuit design on a target device, define a plurality of regions of the target device, and assign the plurality of regions to respective subsets of the plurality of processors. The instructions further cause the processors to perform global routing of nets of the netlist on the target device. The global routing of each net restricts the net to one or more possible routes through a corresponding subset of the plurality of regions. The instructions further cause the processors to concurrently perform local routing of the netlist within the plurality of regions using the respective subsets of the processors. Within each region, the local routing of the netlist is performed by only the respective set of one or more processors.

The instructions, in another embodiment, further cause the plurality of processors, in response to a failure to locally route a net within a first region of the subset of the plurality of regions, to shift boundaries between two or more regions including the first region and a second region of the plurality of regions. The net is locally rerouted within one or more regions in the corresponding subset of the plurality of regions.

In another embodiment, the instructions further cause the plurality of processors, in response to a failure to locally route a net within a first region of the subset of the plurality of regions, to perform a second global routing of the net on the target device. The net is restricted to one or more possible routes through an additional subset of the plurality of regions. The net is locally rerouted in the additional subset of the plurality of regions.

Performing local routing of the netlist within each of the plurality of regions, in another embodiment, includes determining congestion data including costs of routing resources for the region, and routing portions of nets within the region according to the congestion data.

In another embodiment, the instructions further cause the plurality of processors to determine critical and non-critical nets. In routing the portions of nets within the region, critical nets are given priority over non-critical nets for the routing resources.

The local routing of the netlist within the plurality of regions is performed in iterations in another embodiment. Each iteration routes a respectively selected net within each region. The determining of congestion data includes updating the congestion data between iterations of the local routing.

In another embodiment, updating the congestion data includes communicating status messages indicating routability of a net to the respective sets of one or more processors of the plurality of processors for one or more regions in the subset of the plurality of regions through which possible routes for the net are restricted. Local routing of the netlist includes rerouting the net by the respective sets of one or more processors of the one or more regions in response to status messages indicating the net is unroutable, and assigning routing resources of the one or more regions to the net by the respective set of one or more processors of the one or more regions in response to status messages indicating the net is routable.

The local routing of the netlist, in another embodiment, includes locally routing a net of the netlist within a first region, the net having a destination outside the first region. The local routing of the net within the first region includes determining possible routes from a source of the net in the first region to one or more edge-pins on a boundary between the first region and an adjacent region in the subset of regions. Messages indicating one or more of the one or more edge-pins as options for continuing a route of the net to a destination, are communicated from a processor assigned the first region to a processor assigned the adjacent region.

In yet another embodiment, an article of manufacture is provided. The article includes a processor-readable storage medium configured with processor-executable instructions. The instructions, when executed by a plurality of processors, cause the plurality of processors to perform a number of operations. The instructions cause the processors to determine placement of a netlist of the circuit design on a target device and define a plurality of regions of the target device. The plurality of regions is assigned to respective subsets of the plurality of processors. The instructions further cause the processors to perform global routing of nets of the netlist on the target device. The global routing of each net restricts the net to one or more possible routes through a corresponding subset of the plurality of regions. The instructions further cause the processors to concurrently perform local routing of the netlist within the plurality of regions using the respective subsets of the processors. Within each region, the local routing of the netlist is performed by only the respective set of one or more processors.

It will be appreciated that various other embodiments are set forth in the Detailed Description and Claims, which follow.

BRIEF DESCRIPTION OF THE DRAWINGS

Various aspects and advantages of the embodiments of the invention will become apparent upon review of the following detailed description and upon reference to the drawings, in which.

DETAILED DESCRIPTION

Figure 1:
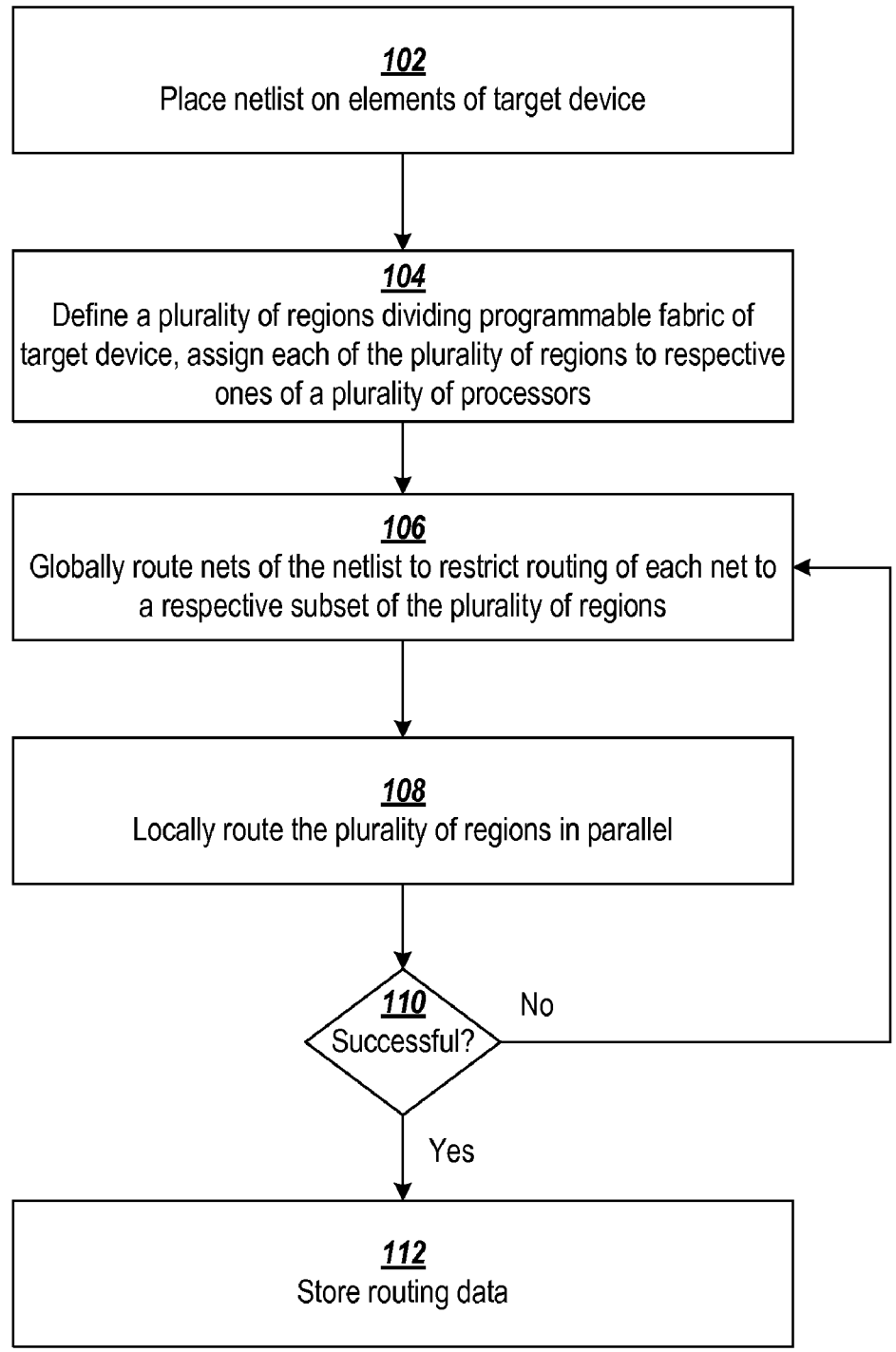
FIG. 1 shows a flowchart of a process for routing a circuit design in accordance with one or more embodiments.

The process of finding a valid route for all nets that minimizes some measure of cost is an NP-Hard problem. Many programmable integrated circuit (IC) routing tools are based on a negotiated congestion resolution scheme. In a typical implementation, for example, the Pathfinder algorithm, nets are routed sequentially. A path through the programmable resources of the programmable IC is determined by an expansion of possible paths from a source to a destination.

In the process of routing a net, other nets may have been already routed on the wire resources required to route the unrouted signal. When two nets use the same resource, it is known as congestion. A cost of resource use for each possible path is tracked and maintained during expansion of the possible paths to reflect the demand for use of each resource for routing. In response to two or more nets attempting to route with the same resource, the cost of the congested resource is increased and the nets that attempted to use the congested resource are rerouted. The increased cost encourages the nets to be routed using other (less expensive) resources. Nets having limited routing resources available to provide a possible path from the source to the destination may use the congested resources if those resources provide the least expensive path in spite of their increased cost. In this manner, nets are iteratively routed while adjusting resource costs to find a solution.

In the future, it is expected that processor cores will not increase in speed, but computers will be built with many cores that execute processes in parallel. Utilizing a multi-core architecture, one method to reduce the time needed for signal routing involves routing nets in parallel using multiple processors. One problem posed by the parallel routing of nets is that the information about resource costs is modified as each of the parallel routed nets is routed. If multiple processors are routing nets, there is a high cost to synchronize access and updates to the resource cost information of the routing resources. The resource cost information is also referred to as congestion data and such terms may be used interchangeably herein. As the number of processors is increased, the gain provided by the additional processor eventually will be outweighed by the additional burden to synchronize operations with the additional processor because the routing speed will be dominated by operations that read and modify the resource cost information.

The described embodiments facilitate independent parallel routing by apportioning a programmable IC into a number of mutually exclusive regions and independently routing the netlist within the respective regions in parallel.

The need to synchronize access to resource cost information is avoided by maintaining an independent subset of resource cost information for each region while routing the nets. The processors independently route portions of nets within each region using the local resource cost information. Each processor communicates with processors assigned to neighboring regions to route the nets between regions. The ability to read or modify the routing resource costs for a region is limited to one or more processors responsible for routing nets within the region. In this manner, the complexity of synchronization of access and updating of congestion data is reduced—allowing more processors to work in parallel.

Nets may be routed using a number of different routing algorithms. For ease of illustration, the embodiments and example implementations herein are described with reference to the Pathfinder routing algorithm. One skilled in the art will understand that a number of other algorithms may be used to route net portions within each region, including, for example, maze routing, A* search routing, versatile place and route, ROAD, etc.

In one embodiment, nets are globally routed on a regional level, to restrict routing of each net to a subset of regions. Following global routing, local routing is performed within each region to route net portions through specific routing resources.

FIG. 1 shows a flowchart of a process for routing nets in accordance with one or more embodiments. Placement is performed at step 102 to place the netlist on elements of the target device. Programmable fabric of the target device is apportioned into a plurality of regions at step 104. Respective processors are assigned to the plurality of regions. Nets of the netlist are globally routed at step 106, which effectively restricts the route of each net to a respective subset of the plurality of regions. The plurality of regions are independently locally routed in parallel at step 108. The local routing of a net selects specific routing resources in the respective subset of regions for the route of the net. If local routing is unsuccessful, global routing may be repeated to reroute one or more nets at step 106. If local routing is successful at decision step 110, routing data is stored at step 112.

Routing resources may be apportioned into regions in a number of ways. In one embodiment, the division into regions should take into account the hardware layout of the programmable IC. For example, in the Xilinx Virtex 4 family of ICs, block RAMs and DSP fixed blocks are four rows tall, with inputs and outputs connecting to the switchboxes in all four different rows. In the Virtex 5 and 6 families, the block RAM and DSP blocks are five rows tall. One embodiment may apportion routing resources to separate regions according to the natural divisions of programmable fabric on a target device. In another embodiment the regions may have sizes that vary from one to another based on placement of logic, for example.

Figure 2:
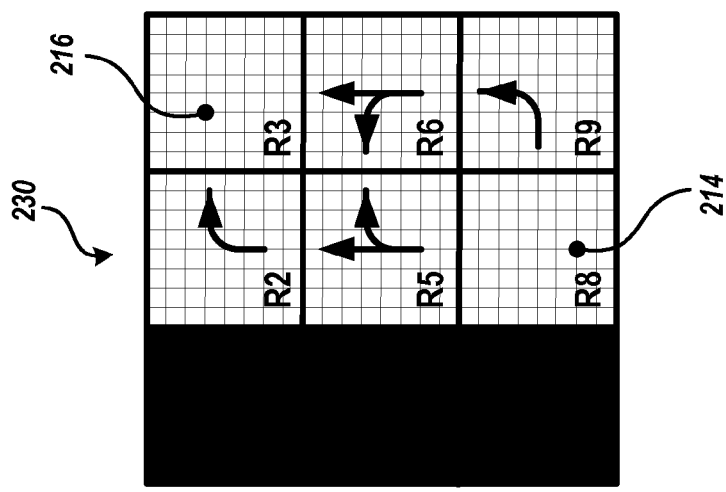
FIG. 2 shows an illustrative example of global routing of a net through programmable fabric apportioned into a plurality of regions.
Figure 2:
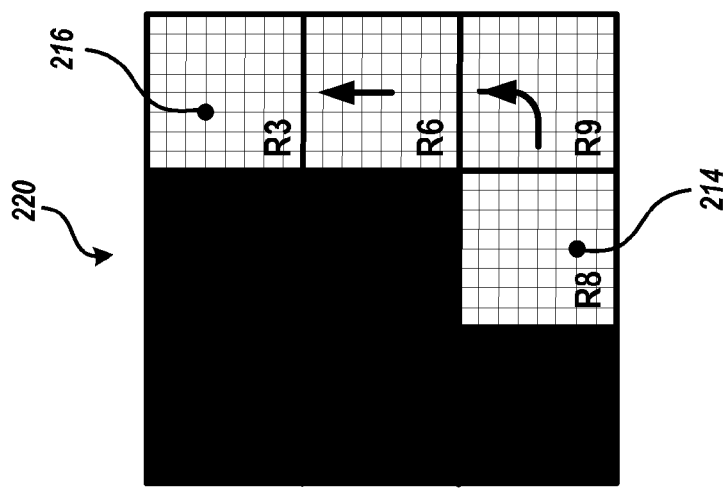
Figure 2:
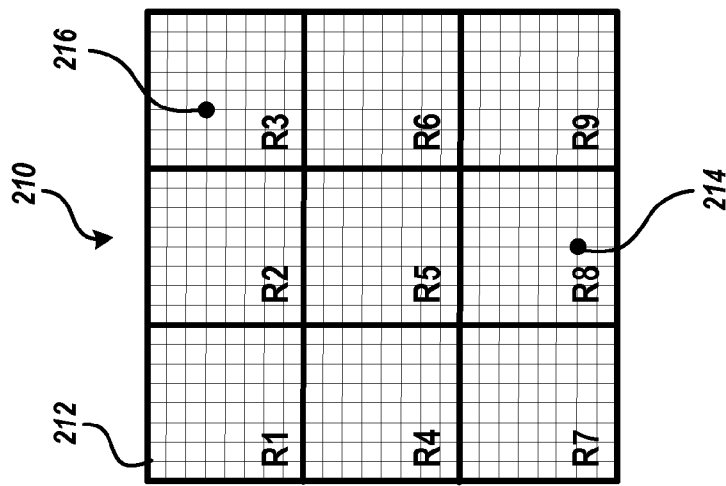

FIG. 2 illustrates an example of global routing of a net through a plurality of regions. State 210 shows an example programmable fabric 212 apportioned into nine regions R1-R9. This example shows one net to be routed from source pin 214 in region R8 to destination pin 216 in region R3. Global routing may be implemented to have multiple possible paths through the regions or a specific path through the regions. State 220 illustrates the result of globally routing a net from the source pin 214 to the destination pin 216, wherein the specific routing of the net will be restricted to a series of regions. In this example, the net is restricted to be routed though regions R8→R9→R6→R3. In subsequent local routing, the fan-out of paths leaving a region is limited to the boundary of one adjacent region. For example, possible paths from source pin 214 leaving region R8 are limited to pins on a boundary between R8 and R9.

State 230 illustrates an alternative global route in which local routing of the net is restricted to multiple alternative region-level paths. In this example, global routing restricts the net to regions R2, R3, R5, R6, R8, and R9. Possible regional-level routes from pin 214 to pin 216 include:

R8→R5→R2→R3
R8→R5→R6→R3
R8→R9→R6→R3; and
R8→R9→R6→R5→R2→R3

In subsequent local routing of the net in region R8, the fan-out of possible paths would include boundary pins between regions R8 and R5 and boundary pins between regions R8 and R9. Increasing the number of possible paths may allow local routing to avoid routing through congested regions.

Figure 3:
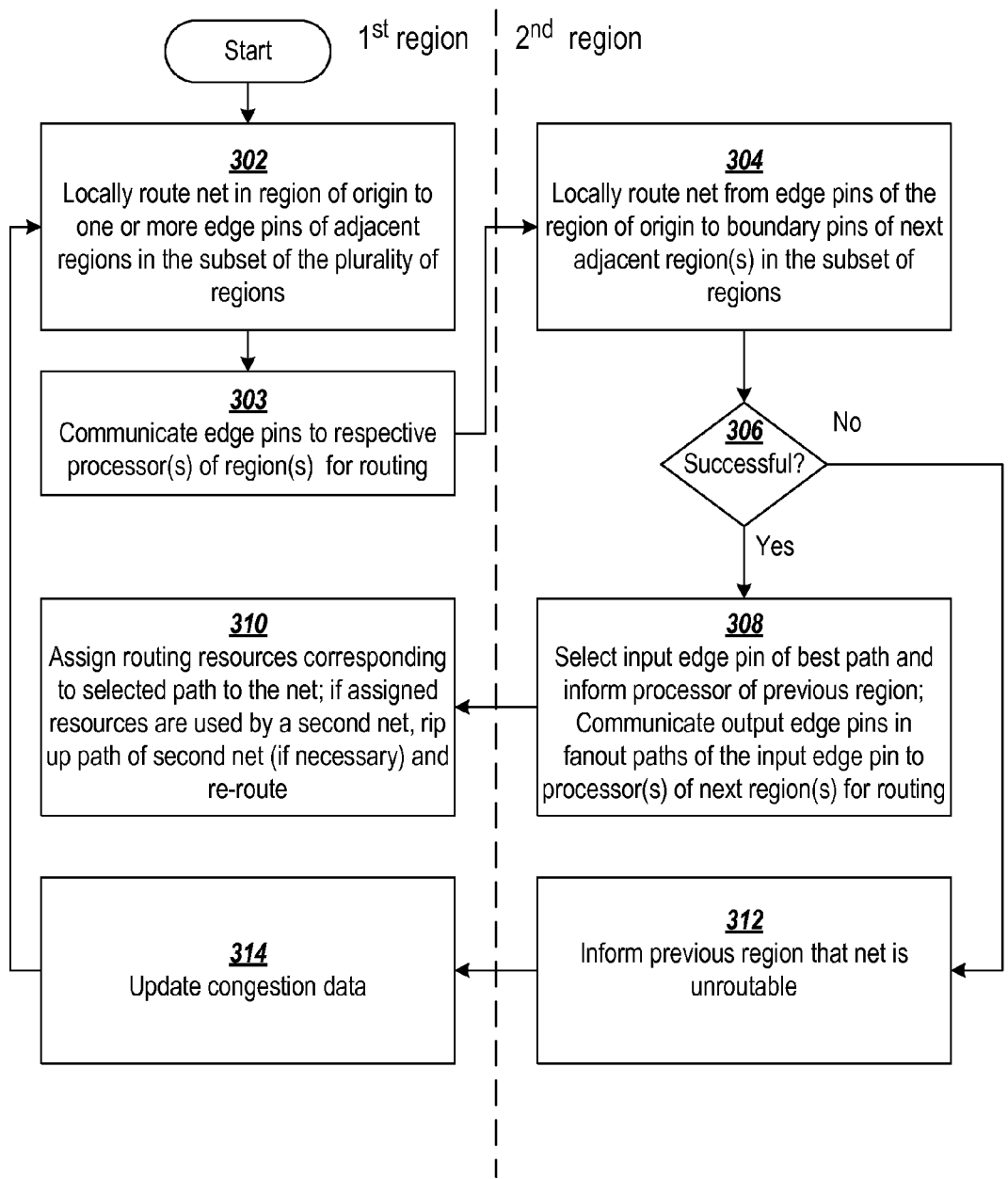
FIG. 3 shows a flowchart of an example process for locally routing a circuit design in accordance with one or more embodiments.

FIG. 3 shows a flowchart of an example process for locally routing a circuit design in accordance with one or more embodiments. Local routing is also known as detailed routing and such terms are used interchangeably herein. In the flowchart of FIG. 3, the local routing performed in two regions of a global route of a net is illustrated. It will be recognized that the illustrated processing may be replicated for additional regions in the global route. In local routing of a net, a simple expansion of possible paths is performed within a particular region to determine one or more possible paths from a source pin to one or more edge-pins of the region at step 302. The expansion of possible paths may be referred to as wave-front expansion and such terms are used interchangeably herein.

The adjacent regions to which the net may be routed are limited to the subset of regions selected during global routing. Possible paths to other adjacent regions are discarded. The edge-pins on the possible paths are communicated to the respective processor(s) of the region(s) for continued routing of the net at step 303. The routing method can be implemented to pass only a preferred edge-pin, every edge-pin on a possible path, or a subset of the determined edge-pins. The determination of the number of edge-pins to pass to a processor for continued routing of the net can change during the course of a routing task. For example, the number of edge-pins communicated may be increased for a net that was difficult to route in subsequent regions in previous unsuccessful attempts to locally route the net.

Within each of the respective regions, at step 304, local routing is performed to determine one or more possible paths from the edge-pins communicated in step 303 to one or more edge-pins of the next adjacent region(s). If a successful path is found at decision step 306, an input edge-pin of the preferred path is selected and communicated to the processor of the previous adjacent region at step 308. Output edge-pin(s) of possible paths from the selected input edge-pin are communicated to the respective processor(s) of the next adjacent region(s). The output edge-pins are used as starting points for continued routing. Routing resources of the path from the source pin to the edge-pin, as selected at step 308, are assigned to the net for the route in the 1$^{st}$ region at step 310. If the routing resources assigned to the net have also been used in the route of a second net, the nets are ripped up and re-routed.

If local routing is unsuccessful at decision step 306, the processor of the previous region is informed that the net is unroutable from the edge-pins communicated at step 303. The congestion data is updated at step 314, and rerouting of the net is attempted at step 302. The congestion data may include increased routing resource costs for those routing resources sought for use by two or more nets during local routing.

Figure 4:
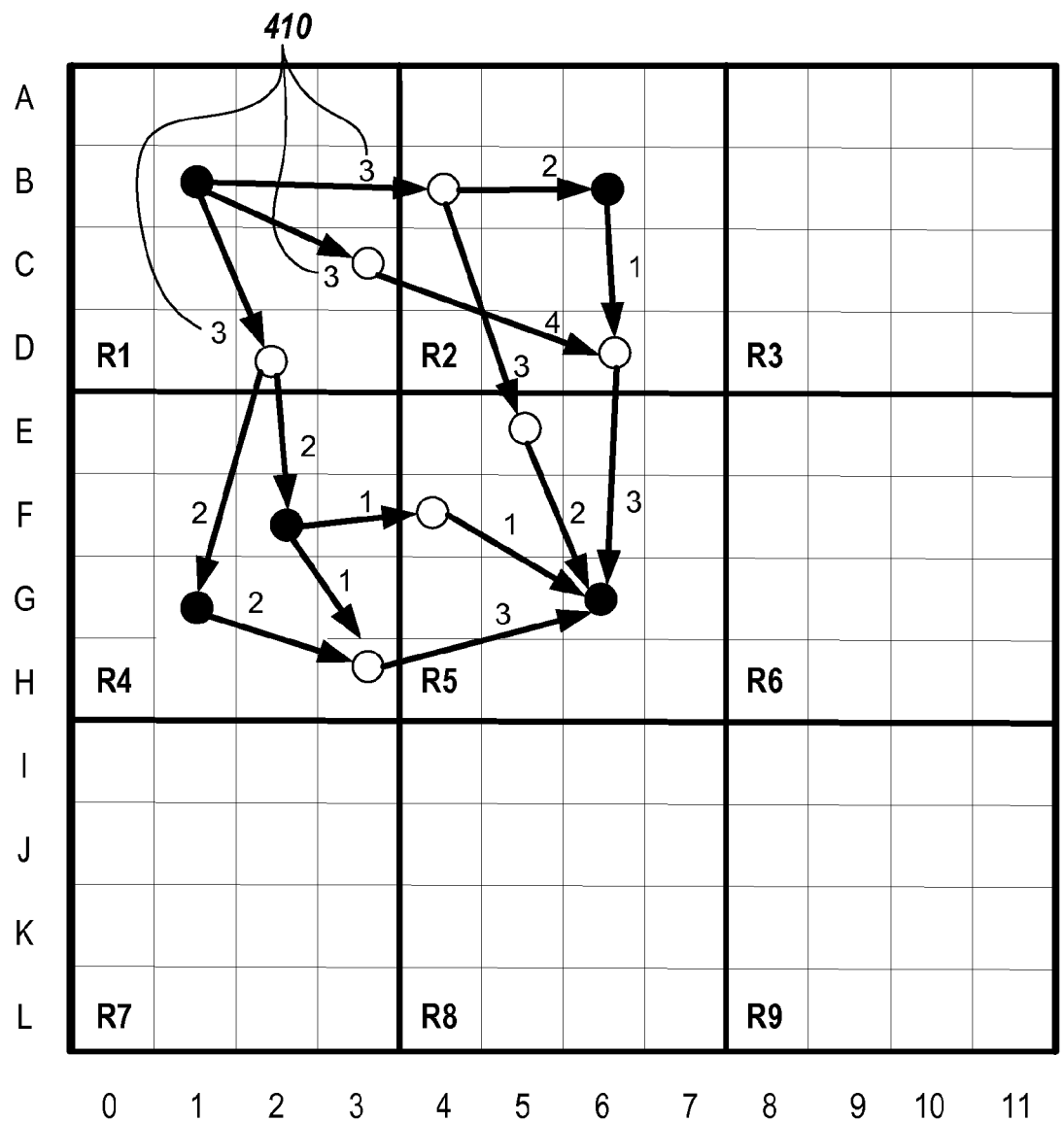
FIG. 4 shows an illustrative example of locally routing a net through a plurality of independently routed regions in accordance with one or more embodiments.

FIG. 4 shows an example of locally routing a net through a plurality of independently routed regions in accordance with one or more embodiments. In this example, a net is routed from a source pin located at row B, column 1 (B1) of region R1 to a destination pin located at G6 of region R5. White pins represent edge-pins and black pins represent non-edge-pins. For example, pins B4 and C3 are edge-pins on the boundary between regions R1 and R2 and are viewable by processors of both regions.

The processor assigned to region R1 locally routes the net and determines three possible paths through edge pins (B4, C3, and D2) that reach regions R2 and R4. The processor of region R1 sends messages to the processors of regions R2 and R4, communicating the respective edge-pins along with the respective resource costs (410), as starting points for continued routing of the net. The processors may then continue routing the net in respective regions R2 and R4 in parallel. In routing the net in region R2, two edge-pins D6 and E5 are found to be in possible paths from region R2 to the destination.

In this example, the processor of each region is configured to select the source edge-pin which provides the shortest path to a destination edge-pin of the next region and continue routing from the selected source edge pin. The possible path B1→B4→E5 has the lowest resource cost (3+2). As a result, the processor of region R2 communicates a message back to the processor of region R1 that is has selected to continue routing from edge-pin B4. The processor of region R1 assigns routing resources B1→B4 to the net.

It may be possible for the selected resource B1→B4 to become congested while the net was being routed within region R2. If any of the routing resources from B1 to B4 were also assigned to another net, at least one of the nets must be rerouted. The processor in the region can either try to find another route for one of the nets, or may increase the cost of the routing resource in the congestion data and reroute the conflicting nets, communicating appropriate messages to the processors of affected regions.

Edge-pins D6 and E5 are communicated from the processor of region R2 to the processor of region R5 for continued routing. Routing in region R4 may be concurrently performed in a similar manner resulting in edge-pins F4 and H3 being communicated to the processor of region R5 as starting points for continued routing of the net. In routing the net in region 5, path B1→D2→F2→F4→G6 is determined to be the shortest path and is selected as the routed path and appropriate messages are communicated to the processors of regions R2 and R4.

It is noted that the routing of the net through regions R2 and R4 may not take place and/or complete concurrently. The best path to destination G6 may be selected in a number of different ways. In one implementation, each net may have a unique identification number and messages indicating edge-pins to use as starting points for continued routing include the net identification number. In this manner, possible paths of a net from different regions can be recognized by the converging region R5 and analyzed to determine the preferred path. In another implementation, completed paths can be compared and selected from the source region R1 when notified of completion.

One skilled in the art will recognize that the local routing performed by the embodiments described herein may be implemented in a number of different ways. One example routing flow may involve concurrent operations by different processors. The tasks performed by a processor may have different priorities, and the processor performs tasks according to priority. If a processor does not have any tasks to complete, it may signal an executive processor, and the processor could be re-assigned to process another region if there were more regions than processors. Alternatively, the processor may go idle until more tasks arrive. In this example, a processor may perform the following local routing tasks in decreasing priority:
1) Handle messages and update congesting information for multi-driven nets;
2) Start routing a net that has a destination outside the assigned region and communicate edge-pins corresponding to possible routes to the processors of other regions;
3) Route a net whose destinations are all inside the assigned region; and
4) Restart routing a net that has some available routing resources after removing a routed net.

In the handling of messages, different priorities may be assigned to different types of messages. For example, a processor may handle the following example messages in decreasing priority:
1) Messages indicating that a part of a net must be re-routed;
2) Messages indicating a completed route;
3) Messages indicating edge-pins to be used as starting points for the expansion of possible paths for a net that has destinations that are beyond the assigned region; and
4) Messages indicating edge-pins to be used as starting points for routing nets in the assigned region where the nets have destinations in the assigned region.

There are two types of messages indicating that a part of a net must be re-routed: downstream and upstream. A downstream reroute message will propagate to processors of regions toward the destination of the net. An upstream reroute message will propagate to processors of regions toward the net's source until a fanout point is encountered. The route of the indicated net will be ripped up and the routing resource cost information is updated. Upon receiving a message indicating a completed route, congestion/resource cost information is updated to reflect that the resources are used by a completed route. In one implementation, the resource costs may be increased to a high value to prevent other nets from trying to route with these resources. If necessary, messages indicating one or more nets need to be re-routed are communicated to the processors(s) other region(s). Messages indicating the completed route are forwarded to the processor(s) of region(s) toward the source region, if the source of the net is not in the same region as the destination.

For messages indicating edge-pins to be used as starting points for a net that has a destination that is beyond the source region, it can be known in advance how many edge-pin messages can be received from different processors to initiate pass-thru routing of the same net based on the direction to the source and the length of wires compared to the size of the regions. This would enable a processor of a region to wait until all the expected messages had been received before starting to compute a route. Alternatively, the processor could work on routes for the nets for which the greatest number of messages had been received, and then send edge-pin starting point messages on to the processor(s) of other region(s). A processor may also detect reaching the destination in the assigned region and send completed route messages back to the processor(s) of regions toward the net's source. Similarly, for messages indicating edge-pins to be used as starting points for routing a net that has its destination in the assigned region, the processor may look for multiple messages for the same net (possibly received from processors of different regions). The processor will send completed route messages back to the processor(s) of region(s) toward the net's source.

One skilled in the art will recognize that some routing resources can be driven from more than one segment. For example, the "long lines" in Xilinx's Virtex-5 family of FPGAs can be driven from either end. In Virtex-2 FPGAs, the long lines can be driven from multiple points along the resource. The routing resource is used whenever any of the drivable segments is used. To handle these resources, one of the drivable segments may be designated as the canonical driver. When recording that a net uses one of the segments that is not the canonical driver, the usage of the resource may be recorded at the canonical driver. If the canonical driver is within this region, it is directly updated as if the net were using the canonical driver instead of the segment that is not the canonical driver. The processor of the region will record the segment that is not the canonical driver in the actual resources used to route the net. When the canonical driver is in a region other than the region(s) of the segments that are not the canonical driver, the processor of that other region will send a message to the processor of the region of the other segments indicating that the processor owns the canonical driver; the receiving processor records the usage. The receiving processor also updates the resource cost data for the segment, which may necessitate rerouting of conflicting nets. The receiving processor sends messages back to the processor(s) of each region(s) with a segment that is not the canonical driver indicating the current cost for using the resource.

During wave-front expansion, the processor of a region may use a data structure to track the most current cost information for each resource driven by the net, along with the source of the path to the driven resource. This information may be stored for each net from when routing begins until routing has completed, or a subset of the information may be stored (keeping information only for segments on paths that extend into another region), or the information may be re-created. The method that re-creates the information may involve receiving a message from the processor of another region that a particular segment was selected to be on a route of the net. Storing the information would use more memory, re-creating the information would use more computation time. However, the rerouting option may enable the processor to determine a different route through the region and possibly avoid congestion that had developed between when the net was first routed in the region and when the path was selected.

One skilled in the art will recognize these routing examples are not exhaustive and other various implementations of communication and selection of possible paths may be used as well. For example, timing analysis may be performed to distinguish timing-critical nets from non-critical nets. In determining resource costs of possible paths, timing-critical nets can be given priority over non-critical nets to be routed with congested resources. As another example, routing may be implemented to allow developers to manually assign specific routing resources to a net, which will not be modified during routing.

Regions of routing resources may be also assigned to processors according to a number of architectures. In one embodiment, multiple processors may be assigned to a region to route portions of different nets within a region in parallel. This requires synchronization of resource cost information between the processors assigned to the region. The number of processors assigned to the region may be selected to balance the gain achieved by parallel routing of nets against the additional cost of synchronization. In another embodiment, a single processor may be tasked with the local routing of multiple regions. In one embodiment, processors may be dynamically assigned to regions according to availability and workload. If a processor does not have any tasks to complete, it could be re-assigned to process another region as discussed above.

In many situations, rerouting conflicting nets will eventually find a routable solution. However, a situation may arise where no routing solution exists for a congested region or a processor of a region repeatedly attempts to use the same unroutable path in a deterministic fashion. In such situations, a modification to the routing may be needed to break the cycle and reach a solution.

In one embodiment, if one or more nets are determined to be unroutable, global routing is performed once again, restricting routing of one or more nets to new respective subsets of the plurality of regions. Depending on the implementation, a globally rerouted net may be restricted to a new specific path through the regions or may expand the number of regions in the subset to increase the number of possible paths through the regions.

In one implementation, global rerouting of one or more nets is triggered when a net is determined to be unroutable. Unroutable nets can be detected and reported in a number of ways. If the wave-front expansion does not find at least one possible path exiting the source region, the processor of the source region may report that the net cannot be routed, and no further attempts are made to locally route the net until one or more other nets is globally rerouted. Similarly, if the expansion of possible paths does not reach a destination in a region and all available edge-pins were provided as starting points, the processor of the destination region is configured to report that the destination cannot be routed, and no further attempts are made to locally route the net to the destination until one or more nets are globally rerouted. If routes can be found, but nets repeatedly conflict on the same resources for a selected number of iterations, the processor may assume there is a routing failure and report the conflicting nets as unroutable.

In another implementation, global routing may be periodically performed to reroute one or more nets based on congestion within the plurality of regions. Local and global routing could be performed in alternating iterations scheduled by an executive process. If timing analysis is implemented, the executive process may additionally perform periodic timing analysis of nets to update the criticality of nets between iterations. For example, the executive process may perform timing analysis between iterations of global routing, each time a net has a completed route, or in response to the occurrence of some other event.

In another embodiment, the regions may be redefined by shifting the boundaries between two or more regions in response to a net being unroutable. In subsequent wave-front expansion the new boundaries may break previously deterministic routing allowing nets to be routed in a different manner. The shifting of boundaries may also be used to find additional routing solutions. For example, a net near the border of a region may best be routed by crossing into another region and back. One way to handle this scenario is to have a routing process handle more than one region at a time, with boundaries shifting over the course of a routing task. If a net was on the edge of a region at one time during locally routing a net, the net would not necessarily be at the edge in the next iteration.

Figure 5:
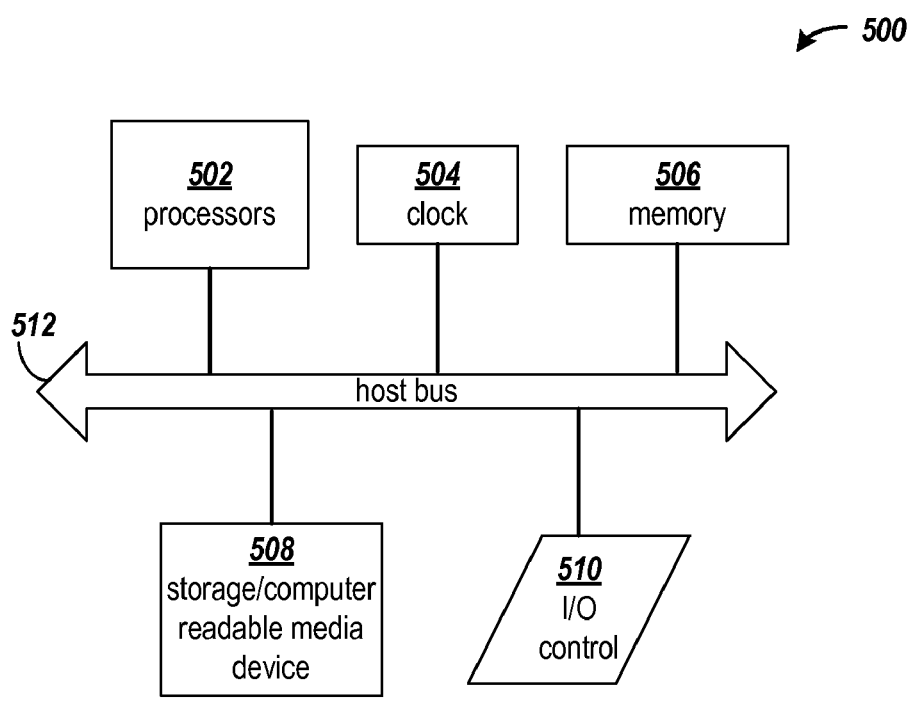
FIG. 5 illustrates a block diagram of a general purpose processor computing arrangement for performing routing processes in accordance with one or more embodiments.

FIG. 5 illustrates a block diagram of a computing arrangement that may be configured to implement the place-and-route processes described herein. Those skilled in the art will appreciate that various alternative computing arrangements, including a plurality of processors and a memory arrangement configured with program code, would be suitable for hosting the processes and data structures and implementing the methods of the different embodiments described herein. The program code, encoded in a processor executable format, may be stored and provided via a variety of computer-readable storage media or delivery channels such as magnetic or optical disks or tapes, electronic storage devices, or as application services over a network.

Processor computing arrangement 500 includes two or more processors 502, a clock signal generator 504, a memory unit 506, a storage unit 508, and an input/output control unit 510 coupled to host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory and a main memory. The storage arrangement 508 may include local and/or remote persistent storage such as provided by magnetic disks (not shown), flash, EPROM, or other non-volatile data storage. The storage unit may be read or read/write capable. Further, the memory 506 and storage 508 may be combined in a single arrangement.

The processor arrangement 502 executes the software in storage 508 and/or memory 506 arrangements, reads data from and stores data to the storage 508 and/or memory 506 arrangements, and communicates with external devices through the input/output control arrangement 510. These functions are synchronized by the clock signal generator 504. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures of the described embodiments.

Figure 6:
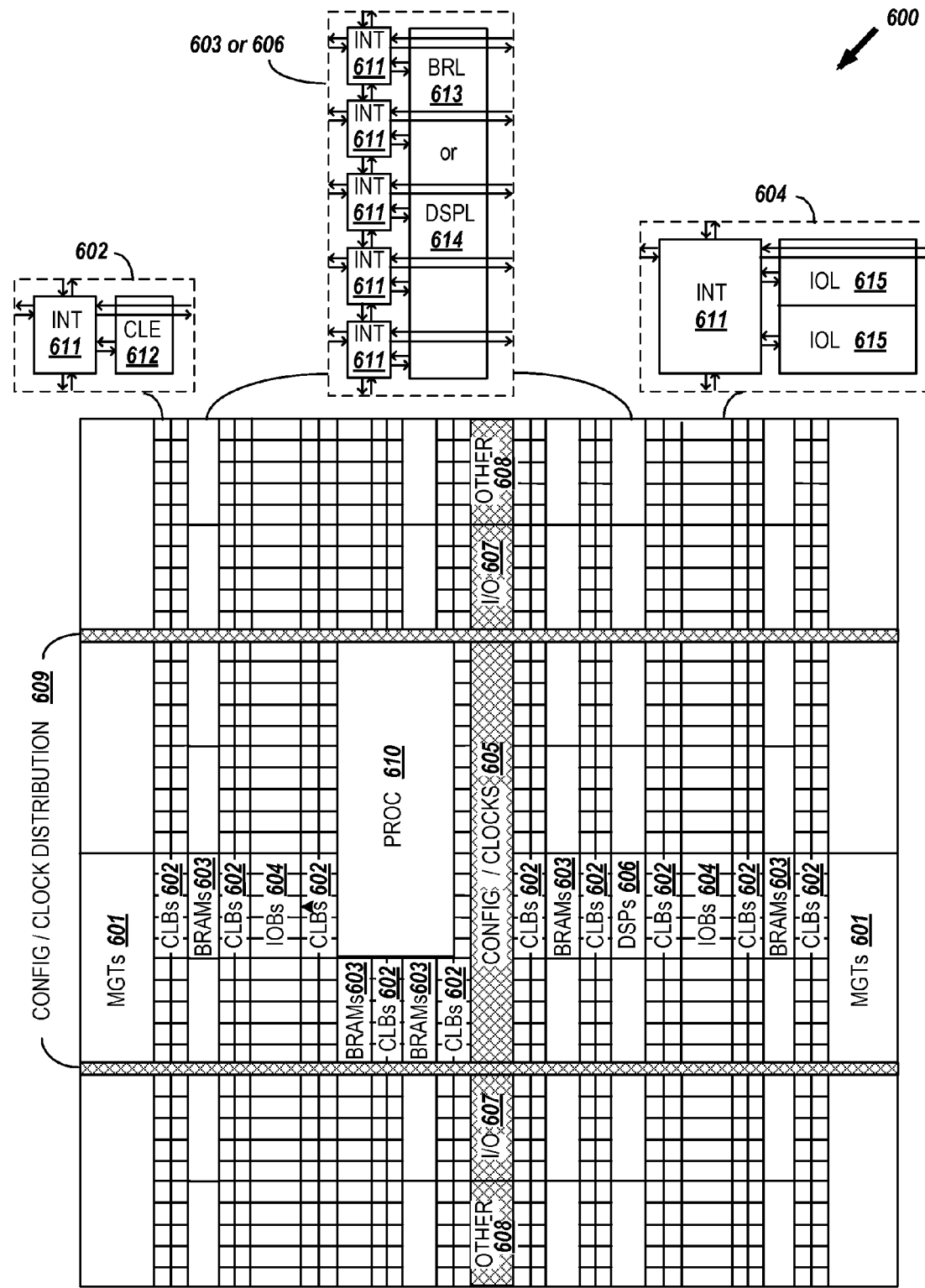
FIG. 6 illustrates a block diagram of an example programmable integrated circuit target device suitable for the routing of a circuit design.

FIG. 6 is a block diagram of an example field programmable gate array (FPGA) which may be used as a target device for place-and-route in accordance with one or more of the described embodiments. FPGAs can include several different types of programmable logic blocks in the array. For example, FIG. 6 illustrates an FPGA architecture (600) that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607), for example, clock ports, and other programmable logic 608 such as digital clock managers, analog-to-digital converters, system monitoring logic, and so forth. Some FPGAs also include dedicated processor blocks (PROC 610). While not shown, it will be appreciated that FPGA 600 also includes external and internal reconfiguration ports.

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element INT 611. A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used.

A DSP tile 606 can include a DSP logic element (DSPL 614) in addition to an appropriate number of programmable interconnect elements. With the FPGA as the target device, an inference pattern would be provided for the DSP logic element(s) available on the device. If portions of the design are found to be optimal, after timing analysis, those portions would be implemented by the DSP elements.

An IOB 604 can include, for example, two instances of an input/output logic element (IOL 615) in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

The present invention is thought to be applicable to a variety of systems for a routing of circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of parallel routing of a circuit design, comprising:
   determining placement of a netlist of the circuit design on a target device;
   defining a plurality of regions of the target device;
   assigning the plurality of regions to respective sets of processors, each set including at least one processor;
   performing global routing of nets of the netlist on the target device, wherein a global route of each net restricts the net to one or more possible routes through a corresponding subset of the plurality of regions;
   concurrently performing local routing of the netlist within the plurality of regions by the respective sets of processors, wherein within each region the local routing of the netlist is performed by only the respective set of at least one processor;
   wherein for local routing a net of the netlist within a first region of the plurality of regions, the net having a destination outside the first region, the local routing includes:
      determining possible routes from a source of the net in the first region to one or more edge-pins on a boundary between the first region and an adjacent region in the subset of regions; and
      communicating messages that indicate one or more of the one or more edge-pins as options for continuing a route of the net to a destination, the messages communicated from a processor of the one or more processors assigned the first region to a processor of the one or more processors assigned the adjacent region; and
   in response to a failure to locally route a net within a first region of the subset of the plurality of regions:
      shifting boundaries between two or more regions including the first region and a second region of the plurality of regions; and
      locally rerouting the net within one or more regions in the corresponding subset of the plurality of regions.

2. The method of claim 1, further comprising, in response to a failure to locally route a net within a first region of the subset of the plurality of regions:
   performing a second global routing of the net on the target device, wherein the net is restricted to one or more possible routes through an additional subset of the plurality of regions; and
   locally rerouting the net in the additional subset of the plurality of regions.

3. The method of claim 1, wherein performing local routing of the netlist within each of the plurality of regions includes:
   determining congestion data including costs of routing resources for the region; and
   routing portions of nets within the region according to the congestion data.

4. The method of claim 3, further comprising:
   determining critical and non-critical nets; and
   wherein, in routing the portions of nets within the region, critical nets are given priority over non-critical nets for the routing resources.

5. The method of claim 3, wherein:
   the local routing of the netlist within the plurality of regions is performed in iterations, each iteration routing a respectively selected net within each region; and
   the determining of congestion data includes updating the congestion data between iterations of the local routing.

6. The method of claim 5, wherein:
   updating the congestion data includes communicating status messages indicating routability of a net to the respective sets of one or more processors of one or more regions in the subset of the plurality of regions through which possible routes for the net are restricted; and
   local routing of the netlist includes:

in response to status messages indicating the net is unroutable, rerouting the net by the respective sets of at least one processor of the one or more regions; and in response to status messages indicating the net is routable, assigning routing resources of the one or more regions to the net by the respective set of at least one processor of the one or more regions.

7. The method of claim 1, wherein the performing of global routing of nets of the netlist on the target device limits nets in each one of the plurality of regions to a selected number.

8. The method of claim 1, wherein the performing of global routing of nets of the netlist on the target device assigns approximately equal numbers of possible routes of nets of the netlist to each of the plurality of regions.

9. The method of claim 1, wherein the defining the plurality of regions defines regions of the device according to boundaries between memory units.

10. A system for parallel routing of a circuit design, the system comprising:
a plurality of processors; and
a memory arrangement coupled to the processor, wherein the memory arrangement is configured with instructions that when executed by one or more of the plurality of processors cause the plurality of processors to perform operations including:
determining placement of a netlist of the circuit design on a target device;
defining a plurality of regions of the target device;
assigning the plurality of regions to respective sets of processors, each set including one or more processors of the plurality of processors;
performing global routing of nets of the netlist on the target device,
wherein a global route of each net restricts the net to one or more possible routes through a corresponding subset of the plurality of regions;
concurrently performing local routing of the netlist within the plurality of regions by the respective sets of processors, wherein within each region the local routing of the netlist is performed by only the respective set of one or more processors;
wherein for local routing a net of the netlist within a first region of the plurality of regions, the net having a destination outside the first region, the local routing includes:
determining possible routes from a source of the net in the first region to one or more edge-pins on a boundary between the first region and an adjacent region in the subset of regions; and
communicating messages that indicate one or more of the one or more edge-pins as options for continuing a route of the net to a destination, the messages communicated from a processor of the one or more processors assigned the first region to a processor of the one or more processors assigned the adjacent region; and
in response to a failure to locally route a net within a first region of the subset of the plurality of regions:
shifting boundaries between two or more regions including the first region and a second region of the plurality of regions; and
locally rerouting the net within one or more regions in the corresponding subset of the plurality of regions.

11. The system of claim 10, wherein the instructions further cause the plurality of processors, in response to a failure to locally route a net within a first region of the subset of the plurality of regions, to perform operations including:

performing a second global routing of the net on the target device, wherein the net is restricted to one or more possible routes through an additional subset of the plurality of regions; and
locally rerouting the net in the additional subset of the plurality of regions.

12. The system of claim 10, wherein performing local routing of the netlist within each of the plurality of regions includes:
determining congestion data including costs of routing resources for the region; and
routing portions of nets within the region according to the congestion data.

13. The system of claim 12, wherein:
the instructions further cause the plurality of processors to determine critical and non-critical nets; and
in routing the portions of nets within the region, critical nets are given priority over non-critical nets for the routing resources.

14. The system of claim 12, wherein:
the local routing of the netlist within the plurality of regions is performed in iterations, each iteration routing a respectively selected net within each region; and
the determining of congestion data includes updating the congestion data between iterations of the local routing.

15. The system of claim 14, wherein:
updating the congestion data includes communicating status messages that indicate routability of a net to the respective sets of one or more processors of the plurality of processors for one or more regions in the subset of the plurality of regions through which possible routes for the net are restricted; and
local routing of the netlist includes:
in response to status messages indicating the net is unroutable, rerouting the net by the respective sets of one or more processors of the one or more regions; and
in response to status messages indicating the net is routable, assigning routing resources of the one or more regions to the net by the respective set of one or more processors of the one or more regions.

16. An article of manufacture, comprising:
a processor-readable storage medium configured with processor-executable instructions, the instructions when executed by a plurality of processors causing the plurality of processors to perform operations including:
determining placement of a netlist of the circuit design on a target device;
defining a plurality of regions of the target device;
assigning the plurality of regions to respective sets of processors, each set including at least one processor of the plurality of processors;
performing global routing of nets of the netlist on the target device, wherein a global route of each net restricts the net to one or more possible routes through a corresponding subset of the plurality of regions;
concurrently performing local routing of the netlist within the plurality of regions by the respective sets of processors, wherein within each region the local routing of the netlist is performed by only the respective set of at least one processor;
wherein for local routing a net of the netlist within a first region of the plurality of regions, the net having a destination outside the first region, the local routing includes:

determining possible routes from a source of the net in the first region to one or more edge-pins on a boundary between the first region and an adjacent region in the subset of regions; and communicating messages that indicate one or more of the one or more edge-pins as options for continuing a route of the net to a destination, the messages communicated from a processor of the one or more processors assigned the first region to a processor of the one or more processors assigned the adjacent region; and in response to a failure to locally route a net within a first region of the subset of the plurality of regions:
  shifting boundaries between two or more regions including the first region and a second region of the plurality of regions; and
  locally rerouting the net within one or more regions in the corresponding subset of the plurality of regions.

\* \* \* \* \*